United States Patent [19]

Uchida

[11] Patent Number: 4,792,834
[45] Date of Patent: Dec. 20, 1988

[54] SEMICONDUCTOR MEMORY DEVICE WITH BURIED LAYER UNDER GROOVE CAPACITOR

[75] Inventor: Yukimasa Uchida, Yokohama, Japan

[73] Assignee: Kabushiki Kaisha Toshiba, Kawasaki, Japan

[21] Appl. No.: 150,505

[22] Filed: Feb. 1, 1988

Related U.S. Application Data

[63] Continuation of Ser. No. 834,519, Feb. 28, 1986, abandoned, which is a continuation of Ser. No. 681,542, Dec. 14, 1984, abandoned.

[30] Foreign Application Priority Data

Jan. 20, 1984 [JP] Japan ................... 59-7957

[51] Int. Cl.$^4$ ............................ H01L 29/78
[52] U.S. Cl. ..................... 357/23.6; 357/23.12; 357/41; 357/55; 365/149
[58] Field of Search ............ 357/23.6, 55, 23.12, 357/41; 365/149

[56] References Cited

U.S. PATENT DOCUMENTS

| 4,116,720 | 9/1978 | Vinson . | |
|---|---|---|---|
| 4,364,074 | 12/1982 | Garnache et al. | 357/23.6 |
| 4,432,006 | 2/1984 | Takei | 357/23.6 |

FOREIGN PATENT DOCUMENTS

| 81-03241 | 11/1981 | European Pat. Off. | 357/23.6 |
|---|---|---|---|
| 0085988 | 8/1983 | European Pat. Off. . | |
| 0088451 | 9/1983 | European Pat. Off. . | |
| 0108390 | 5/1984 | European Pat. Off. . | |
| 84115473.5 | 6/1985 | European Pat. Off. . | |
| 58-3260 | 1/1983 | Japan | 357/23.6 |
| WO81/03241 | 11/1981 | PCT Int'l Appl. . | |

OTHER PUBLICATIONS

Sunami et al., "A corrugated Capacitor Cell (CCC) for Megabit Dynamic MOS Memories," IEDM Dig. Tech. Papers, pp. 806-808, Dec. 1982.

Mano et al., "Submicron VLSI Memory Circuits," IEEE International Solid-State Circuits Conference, LSSCC Dig. Tech. Papers, pp. 234-235, Feb. 1983.

Minegishi et al., "A Submicron CMOS Megabit Level Dynamic RAM Technology Using Doped Face Trench Capacitor Cell," LEDM Dig. Tech. Papers, pp. 319-322. Dec. 5-7, 1983.

Primary Examiner—Joseph E. Clawson, Jr.
Attorney, Agent, or Firm—Finnegan, Henderson, Farabow, Garrett, & Dunner

[57] ABSTRACT

Disclosed is a semiconductor memory device which has a transfer transistor of a MOS structure on a surface of a semiconductor body, and a trenched capacitor having a groove which is formed so as to extend from a surface of the semiconductor body to a certain depth thereof and an electrode which is formed from a bottom portion of the groove to at least a level above an opening of the groove, the source region of the transfer transistor being connected to the electrode of the trenched capacitor and the drain region thereof being connected to a bit line.

4 Claims, 5 Drawing Sheets

SEMICONDUCTOR MEMORY DEVICE WITH BURIED LAYER UNDER GROOVE CAPACITOR

This application is a continuation, of application Ser. No. 834,519, filed Feb. 28, 1986, now abandoned, which is a continuation of Ser. No. 681,542, filed Dec. 14, 1984, now both abandoned.

BACKGROUND OF THE INVENTION

The present invention relates to a semiconductor memory device and, more particularly, to a semiconductor memory device in which a structure of a trenched capacitor is improved.

In recent semiconductor memory devices such as a dynamic memory, a memory capacity thereof has increased four times in three years in accordance with advances in micropatterning techniques. Memory cell area has rapidly become smaller in proportion to a large memory capacity. However, a capacitance of a capacitor of the memory cell must be maintained to be a sufficiently large value of several tens of fF in order to keep a proper S/N ratio for preventing a soft error and for sensing by a sense amplifier.

In order to increase a capacitance per unit area, an insulation film of a metal oxide semiconductor (MOS) structure for the memory capacitor can be rendered thin, or a silicon nitride film can be used as an insulation film material instead of a silicon oxide film. However, since the memory capacitor having a MOS structure is formed on a semiconductor substrate, a capacitance thereof is limited in accordance with micropatterning of the cell area.

Thus, H. Sunami et al. proposed a MOS memory cell having a corrugated capacitor of a structure shown in FIG. 1 which is described in detail in "A Corrugated Capacitor Cell (CCC) for Megabit Dynamic MOS Memories," International Electric Devices Meeting Technical Digest, Lecture No. 26.9, pp. 806 to 808, Dec. 1982. In FIG. 1, reference numeral 1 denotes a p-type silicon substrate. A deep groove 2 (e.g., about 3 to 5 $\mu$m) is formed so as to extend from a surface of the substrate 1 to a certain depth inside thereof. A capacitor electrode 3 formed of a first polycrystalline silicon layer is insulated by a capacitor insulation film 4 and extends from the groove 2 to a level above an opening thereof. The capacitor insulation film 4 has a three-layered structure of $SiO_2/Si_3N_4/SiO_2$. The substrate 1, the groove 2, the capacitor insulation film 4 and the capacitor electrode 3 constitute a trenched capacitor 5. N+-type source and drain regions 6 and 7 which are electrically isolated from each other are formed in a surface region of the silicon substrate 1 near the trenched capacitor 5. A gate electrode 9 formed of a second polycrystalline silicon layer is formed on a gate oxide film 8 in a region of substrate 1 between the source and drain regions 6 and 7. A transfer transistor 10 consists of the source and drain regions 6 and 7, the gate oxide film 8 and the gate electrode 9. Furthermore, the source region 6 is in contact with the insulation film 4 of the trenched capacitor 5, and the drain region 7 is connected to a bit line (not shown). In FIG. 1, reference numeral 9' denotes a gate electrode of an adjacent memory cell.

The MOS memory shown in FIG. 1 has a structure wherein an inversion layer of an interface between the capacitor insulation film 4 of the trenched capacitor 5 and the semiconductor substrate 1 serves as one electrode, and this electrode is connected to the source region 6 of the transfer transistor 10 so as to form a charge accumulation node of the memory cell. In this structure, a data holding time of the memory cell, that is, a pause time is not long enough. This is because the groove 2 which defines the inversion layer serving as one electrode has a large surface area. For this reason, a leakage current flows into the semiconductor substrate, thereby causing memory data loss. In addition to this, a surface of a portion of the semiconductor substrate 1 which defines the groove 2 is roughened by a dry etching process when the groove 2 is formed or is roughened by defects caused by a mechanical stress which is applied upon the groove 2. Thus, the leakage current into the semiconductor substrate 1 is increased, resulting in memory data loss.

In the MOS memory cell shown in FIG. 1, as described above, when one trenched capacitor of two adjacent memory cells is formed near that of the other cell, a punch through phenomenon easily occurs, thereby causing an interference of data. For this reason, a distance between the trenched capacitors of the two adjacent cells cannot be shortened beyond a certain limit. As a result, a high-density memory cell cannot be realized. Furthermore, a junction capacitance between the drain and the substrate of the transfer transistor which constructs the memory cell must be decreased in order to reduce a bit line capacitance. For this reason, an impurity concentration of the p-type silicon substrate must be decreased. However, a depletion layer is then easily formed in a region of the substrate near the capacitor of the MOS structure, thus causing the punch-through phenomenon. The punch-through phenomenon can be prevented to a certain extent by ion-implanting impurity ions in the silicon substrate. However, as shown in FIG. 1, in the trenched capacitor 5 in which the deep groove 2 is formed in the silicon substrate 1, it is difficult to ion-implant an impurity into a deep section of the silicon substrate 1. For this reason, the punch-through phenomenon easily occurs between the bottom portions of the two adjacent trenched capacitors. Therefore, in the conventional structure, the trenched capacitors of the two adjacent memory cells must be spaced apart by a large distance, thus preventing a high-density memory from being realized.

Furthermore, in the structure shown in FIG. 1, since the depletion layer extends from the trenched capacitor 5 in a deep section of the silicon substrate 1, electric charges generated by irradiation of an α-ray can easily concentrate by a funneling phenomenon, and a soft error easily occurs.

SUMMARY OF THE INVENTION

It is an object of the present invention to provide a semiconductor memory device which comprises a trenched capacitor having a long data holding time, i.e., a pause time, and in which a distance between two adjacent trenched capacitors can be considerably shortened without causing a punch-through phenomenon.

According to the invention, there is provided a semiconductor memory device comprising:

a transfer transistor having source and drain regions which are formed in a surface of a semiconductor body so as to be electrically isolated from each other and a gate electrode which is formed on a portion of said semiconductor body between said source and drain regions; and a trenched capacitor having a groove which is formed so as to extend from the surface of said semiconductor body to a predetermined depth thereof and an electrode which is formed from a bottom portion of said groove to at least a level above an opening of said groove through a capacitor insulation film, one of said source and drain regions being connected to said electrode of said trenched capacitor and the other of said source and drain regions being connected to a bit line.

DETAILED DESCRIPTION OF THE PREFERRED EMBODIMENTS

An embodiment of the present invention will be described with reference to FIGS. 2 and 3 hereinafter.

Figure 2:
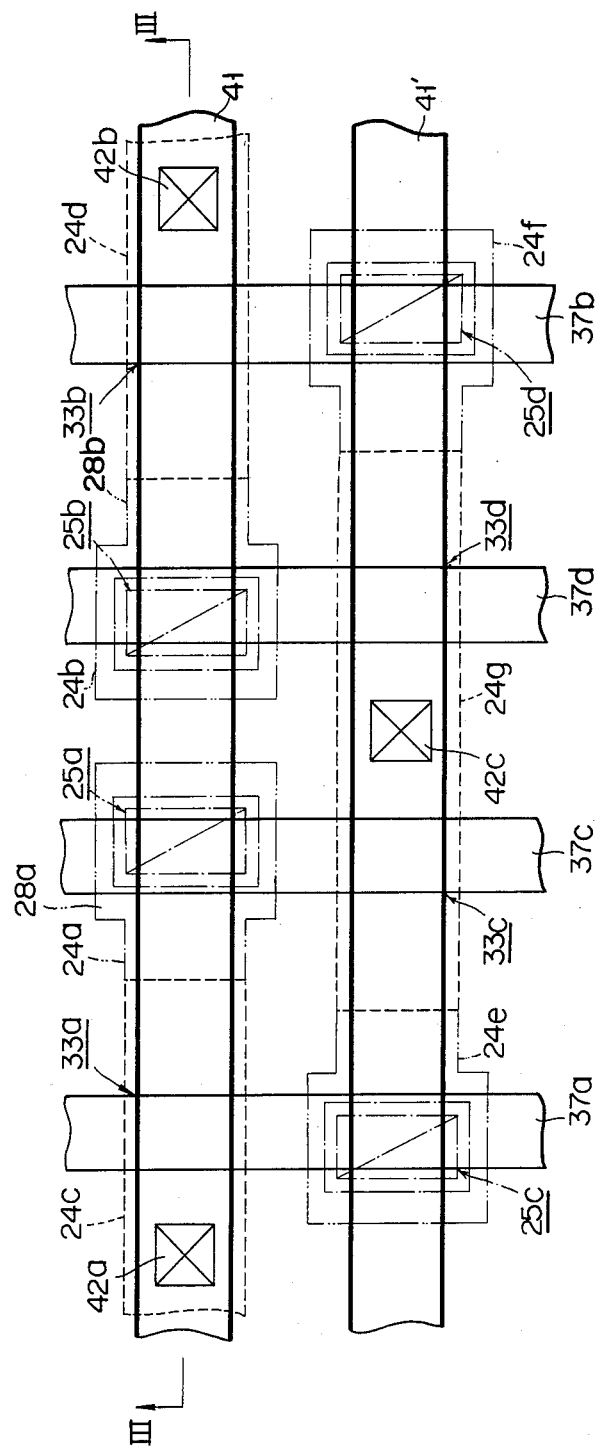
FIG. 2 is a plan view showing a dynamic MOS memory according to an embodiment of the present invention.
Figure 3:
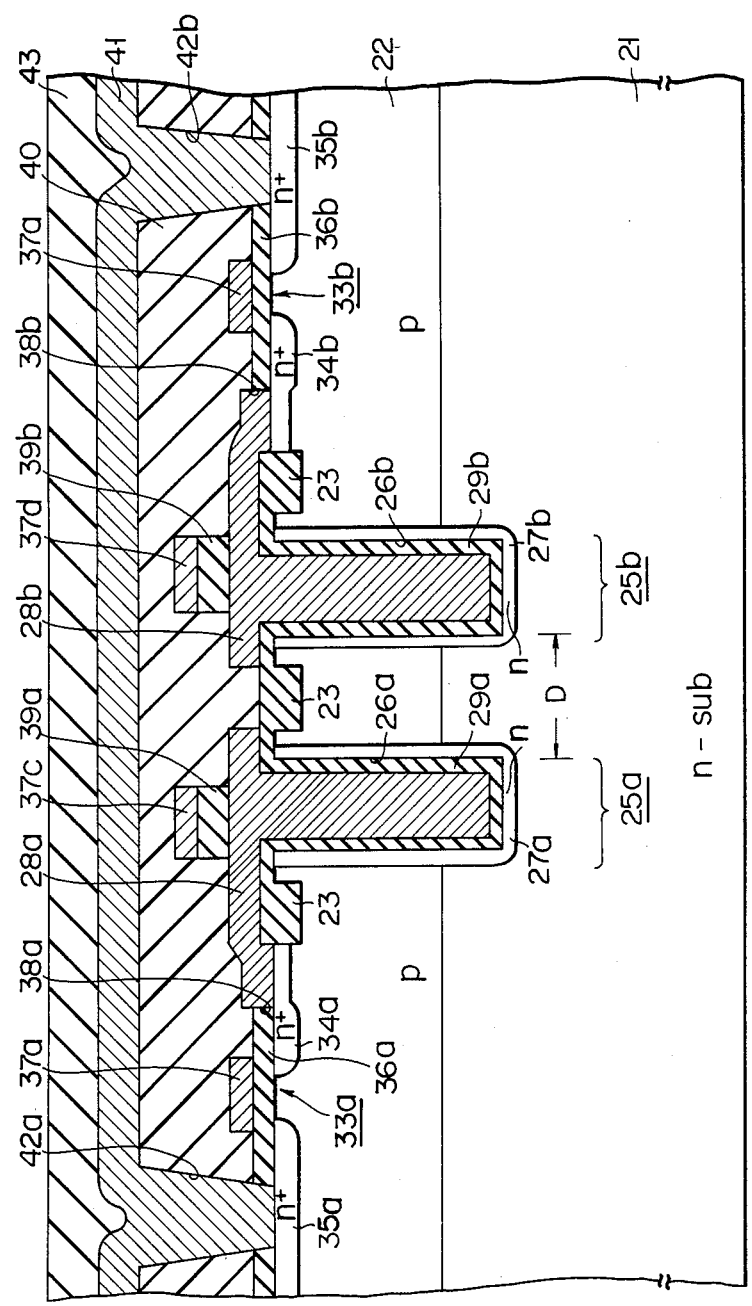
FIG. 3 is a sectional view taken along a line III—III of FIG. 2.

FIG. 2 is a plan view partially showing a dynamic MOS memory, and FIG. 3 is a sectional view taken along a line III—III of FIG. 2. In FIG. 3, reference numeral 21 denotes an n-type silicon substrate containing a doner impurity i.e., an n-type impurity such as antimony, arsenic or phosphorus at a concentration of, e.g., $2\times10^{17}/cm^3$. A p-type silicon layer 22 is formed on the substrate 21 by epitaxial growth. The silicon layer 22 contains an acceptor impurity, i.e., a p-type impurity (boron) at a concentration of, e.g., $2\times10^{16}/cm^3$ and has a thickness of about 3 μm. The silicon substrate 21 and the silicon layer 22 constitute a semiconductor body. A field oxide film 23 which has a predetermined pattern having a plurality of patterned holes and a thickness of, e.g., about 0.6 μm is formed on the silicon layer 22. A plurality of island regions of the silicon layer 22 which are defined by, i.e., surrounded by the patterned holes of the field oxide film 23 form active regions (memory cell regions 24a to 24g). The active regions 24a, 24b, 24e and 24f of these active regions have trenched capacitors 25a, 25b, 25c and 25d, respectively. The trenched capacitors 25a and 25b are arranged so as to be close to each other. As shown in FIG. 3, the trenched capacitor 25a has a groove 26a having a depth of, e.g., 4 μm is formed so as to extend from the surface of the p-type silicon layer 22 to a position inside the silicon substrate 21. An n-type diffusion region 27a in which a doner impurity, i.e, an n-type impurity is diffused, is formed on portions of the silicon layer 22 and the silicon substrate 21 which define the groove 26a. The n-type diffusion region 27a has a depth of about 0.3 μm and a doner impurity concentration of, e.g., $4\times10^{18}/cm^3$. An electrode 28a formed of a first polycrystalline silicon is formed from a bottom portion of the groove 26a to a level above an opening of the groove 26a through a silicon oxide film 29a having a thickness of, e.g., about 200 Å. In the trenched capacitor 25a having such a structure, the electrode 28a serves as a first capacitor electrode (charge storage node) which is in buried contact with a source region of a transfer transistor (to be described later), and the n-type diffusion region 27a serves as a second capacitor electrode. The trenched capacitor 25b has substantially the same structure as that of the trenched capacitor 25a, and consists of a groove 26b, an n-type diffusion region 27b, an electrode 28b (charge storage node) which is in buried contact with the source region of the transfer transistor (to be described later) and a silicon oxide film 29b. Although the trenched capacitors 25c and 25d are not described in detail, these trenched capacitors have the same structures as those of the trenched capacitors 25a and 25b.

Figure 4A:
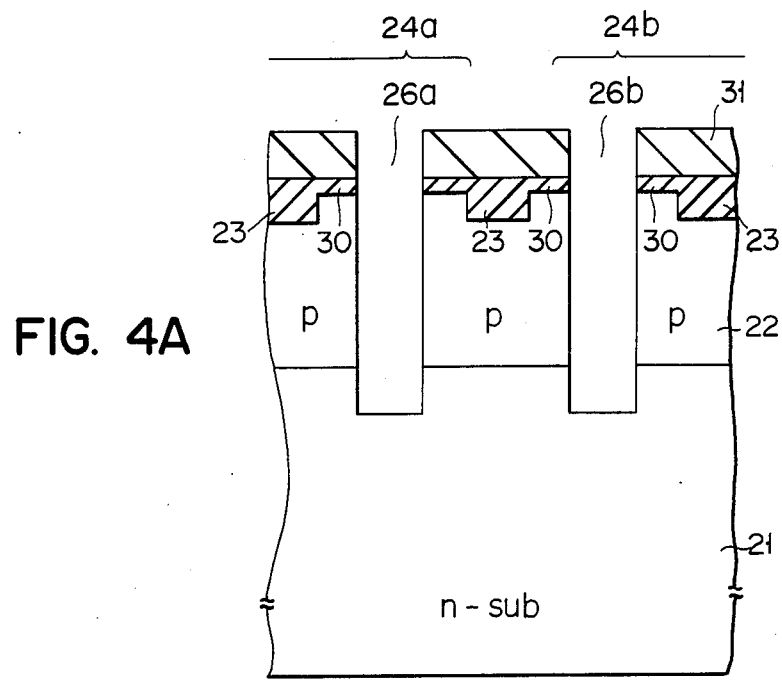
FIGS. 4A and 4B are, respectively, sectional views of structures constructed in processes for forming a trenched capacitor according to the embodiment shown in FIGS. 2 and 3.
Figure 4B:
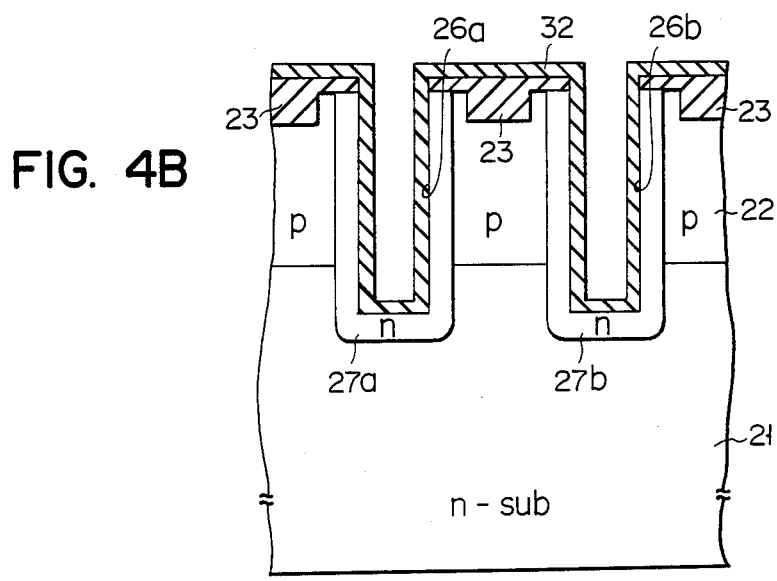

A method of manufacturing the trenched capacitor according to this embodiment will be described with reference to FIGS. 4A and 4B hereinafter.

PROCESS 1 (FIG. 4A)

The p-type silicon layer 22 is formed on the n-type silicon substrate 21 by epitaxial growth. The field oxide film 23 having a predetermined pattern is formed on the silicon layer 22, thereby defining the island active regions 24a and 24b (24c to 24g are not shown). Thereafter, an oxide film 30 having a thickness of about 1,000 Å is formed on surfaces of the active regions 24a and 24b. Subsequently, a photoresist is coated on the overall surface of the resultant structure, and is selectively etched by photoetching so as to form a resist pattern 31 on a prospective groove forming region of the oxide film 30. Then, the oxide film 30 is selectively etched by reactive ion etching using the resist pattern 31 as a mask, and the p-type silicon layer 22 and n-type silicon substrate 21 are selectively etched from a surface of the silicon layer 22 to a position inside the n-type silicon substrate 21 so as to form the grooves 26a and 26b having a depth of, e.g., 3 μm. Thereafter, the resist pattern 31 is removed.

PROCESS 2 (FIG. 4B)

A phosphorus-doped silicon oxide film (or an arsenic-doped silicon oxide film, or a polycrystalline silicon film in which phosphorus, arsenic and the like is doped) 32 is deposited on the overall surface of the resultant structure by a CVD method. Then, doped phosphorus is thermally diffused in the portions of the p-type silicon layer 22 and the n-type silicon substrate 21 which define the grooves 26a and 26b using the phosphorus-doped silicon oxide film 32 as a diffusion source, thereby forming the n-type diffusion regions 27a and 27b as the second capacitor electrodes.

PROCESS 3 (NOT SHOWN)

Thereafter, the phosphorus-doped silicon oxide film 32 and the oxide film 31 are removed. Then, the resultant structure is subjected to thermal oxidation, thereby forming a silicon oxide film on exposed surfaces of the substrate 21 and the silicon layer 22 including the portions defining the grooves 26a and 26b. Contact holes for buried contacts are formed in prospective source or drain regions of the above silicon oxide film to be the respective source or drain regions of the transfer transistors which are formed in the active regions 24a and 24b. Thereafter, a first polycrystalline silicon film doped with an n-type impurity, e.g., phosphorus, is deposited on the overall surface of the resultant structure and is patterned so as to form the first capacitor electrodes which respectively extend from the bottom portions of the grooves 26a and 26b, and are in buried contact with the source or drain regions of the respective transfer transistors through the contact holes. The silicon oxide film is selectively etched using the capacitor electrodes as a mask, and the resultant structure is subjected to thermal oxidation so as to form a gate silicon oxide film for the transfer transistors.

A transfer transistor 33a is formed in the active region 24c near the active region 24a, a transfer transistor 33b is formed in the active region 24d near the active region 24b, and transfer transistors 33c and 33d are formed in the active region 24g near the active regions 24e and 24f. The transfer transistor 33a consists of n+-type source and drain regions 34a and 35a which are formed in a region of the active region 24c near the trenched capacitor 25a so as to be isolated from each other, and a gate electrode 37a which is formed of, e.g., a second polycrystalline silicon layer and is formed on a portion of the active region 24c between the source and drain regions 34a and 35a through a gate oxide film 36a. The gate electrode 37a can be formed of a metal silicide such as molybdenum silicide, tungsten silicide, tantalum silicide, or titanium silicide in place of polycrystalline silicon. The electrode 28a formed of the first polycrystalline silicon layer of the trenched capacitor 25a is in buried contact with the n+-type source region 34a through a contact hole 38a formed in the gate oxide film 36a. The source region 34a which is in buried contact with the electrode 28a is formed by thermal diffusion of phosphorus doped in the electrode 28a formed of the first polycrystalline silicon layer. The transfer transistor 33b similarly comprises n+-type source and drain regions 34b and 35b, a gate oxide film 36b and a gate electrode 37b. The electrode 28b formed of the first polycrystalline layer of the trenched capacitor 25b is in buried contact with the source region 34b through a contact hole 38b which is formed in the gate oxide film 36b. The transfer transistors 33c and 33d comprises source and drain regions, gate oxide films (neither are shown) and gate electrodes 37c and 37d, respectively, in the same manner as in the transfer transistors 33a and 33b. The gate electrodes 37a and 37b of the transfer transistors 33a and 33b cross the electrodes 28c and 28d through oxide films (not shown), respectively. The gate electrodes 37c and 37d of the transfer transistors 33c and 33d cross the electrodes 28a and 28b of the trenched capacitors 25a and 25b through the oxide films 39a and 39b, respectively. An interlayer insulation film 40 is coated on the silicon layer 22 including the trenched capacitors 25a to 25d and the transfer transistors 33a to 33d. Bit lines 41 and 41' formed of, e.g., Al, are arranged on the interlayer insulation film 40 along a direction perpendicular to the gate electrodes 37a to 37d. The bit line 41 is connected to the drain regions 35a and 35b of the transfer transistors 33a and 33b through contact holes 42a and 42b. The other bit line 41' is connected to the common drain region (not shown) of the transfer transistors 33c and 33d through a contact hole 42c. A protective insulation film 43 is coated on the interlayer insulation film 40 including the bit lines 41 and 41'.

In this manner, in the semiconductor memory device of this embodiment, the memory nodes (charge accumulation nodes) of the trenched capacitors (e.g., 25a and 25b) comprise the electrodes 28a and 28b formed of polycrystalline silicon as the first capacitor electrodes which are provided on the respective surfaces of the groove 26a and 26b and are insulated by the silicon oxide films 29a and 29b for the capacitors. In addition, the second capacitor electrodes opposite to the charge accumulation nodes (first capacitor electrodes) comprise the n-type diffusion regions 27a and 27b. The n-type diffusion regions 27a and 27b are respectively in contact with the n-type silicon substrate 21. The first capacitor electrodes 28a and 28b are in buried contact with the source regions 34a and 34b of the transfer transistors 33a and 33b, respectively.

Figure 1:
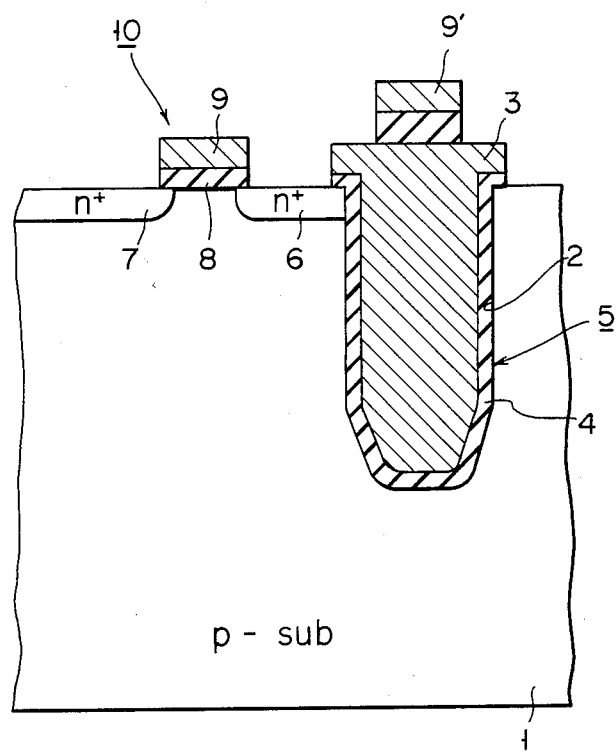
FIG. 1 is a sectional view showing a conventional dynamic MOS memory.

Potential data at 0 V or 5 V with respect to the silicon substrate 21 is accumulated in the first capacitor electrodes 28a and 28b. In accordance with a change in the potential data, an electron current flows from the silicon substrate 21 to the n-type diffusion regions 27a and 27b as the capacitor electrodes. The n-type silicon substrate 21 is biased to, e.g., 5 V (0 V). In the trenched capacitors 25a and 25b having the above structure, almost the entire regions of the charge storage nodes of the first capacitor electrodes 28a and 28b formed of polycrystalline silicon are isolated from the silicon substrate 21 and the silicon layer 22 by the silicon oxide film 29a and 29b for the capacitors. Only the buried contact portions which are in contact with the source regions 34a and 34b of the transfer transistors 33a and 33b form p-n junctions. The conventional MOS memory cell shown in FIG. 1 has a structure wherein the inversion layer of the interface between the capacitor insulation film and the semiconductor substrate serves as one electrode, and this electrode is connected to the source region of the transfer transistor, thereby forming the charge accumulation node of the memory cell. The data loss due to the leakage current which flows into the semiconductor substrate easily occurs in this conventional structure. However, in this embodiment, the data loss due to the leakage current can be prevented. Therefore, the memory data holding time, i.e., the pause time can be prolonged, resulting in improvement of reliability.

In the same manner as described above, the punch through phenomenon between the two adjacent trenched capacitors (e.g., 25a and 25b) can be prevented. As a result, a distance D between the trenched capacitors 25a and 25b is determined only by a processing precision of the grooves 26a and 26b. In fact, even when the distance D between the trenched capacitors 25a and 25b was as short as 0.6 $\mu$m, no punch through phenomenon between the trenched capacitors 25a and 25b occurred. Note that in the conventional structure of the trenched capacitor 5 shown in FIG. 1, when the two trenched capacitors were spaced by about 2 $\mu$m, the punch through phenomenon occurred. In this embodiment, this results in an improvement of more than three times in terms of distance. Therefore, a high-density memory cell can be realized. In addition, in this embodiment, a junction capacitance of the bit line is not increased.

Furthermore, most of the charge accumulation node of the trenched capacitor, e.g., 25a is isolated from the silicon substrate 21 and the silicon layer 22 by the capacitor oxide silicon film 29a, and the source and drain regions 34a and 35a of the transfer transistor, e.g., 33a, are formed in the p-type silicon layer 22. In addition to this, the n-type silicon substrate 21 which has a reverse bias is positioned under the silicon layer 22. For this reason, a semiconductor memory device having a good anti-soft error property can be realized. This is because it is difficult for a soft error to occur in the isolated portion of the charge accumulation node, and minority carriers of carriers generated by $\alpha$-particles can be easily discharged toward the silicon substrate 21 which has a reverse bias.

In the above embodiment, the n+-type regions 34a and 34b serve as the source regions, and the n+-type regions 35a and 35b serve as the drain regions. However, the n+-type regions 34a and 34b can be the drain regions and the n+-type regions 35a and 35b can be the source regions. Also, in the above embodiment, the n-type silicon substrate is used as a semiconductor substrate, and the p-type silicon layer is used as a semiconductor layer. However, instead of these, a p-type silicon substrate and an n-type silicon layer can be used. In this case, the regions 27a, 27b... are p-type, and the transfer transistor becomes a p-channel MOS transistor. A semiconductor body having a structure, in which an acceptor impurity is selectively doped in an n-type silicon substrate having a concentration of $2 \times 10^{15}/cm^3$ so as to form a p-type well region having an acceptor impurity concentration of $2 \times 10^{16}/cm^3$ as a semiconductor layer, can also be used.

In the above embodiment, the silicon oxide film is used as a capacitor insulation film. The present invention is not limited to this. For example, a three-layered film in which a silicon nitride film is sandwiched by silicon oxide films, a silicon nitride film or a two-layered film of silicon oxide and tantalum oxide can be used.

In the above embodiment, a dynamic MOS memory is described as an example, but the present invention can be applied to a static MOS memory. In this case, the above-mentioned trenched capacitor may be provided in a bistable node of a cell of flip-flop type.

Figure 5:
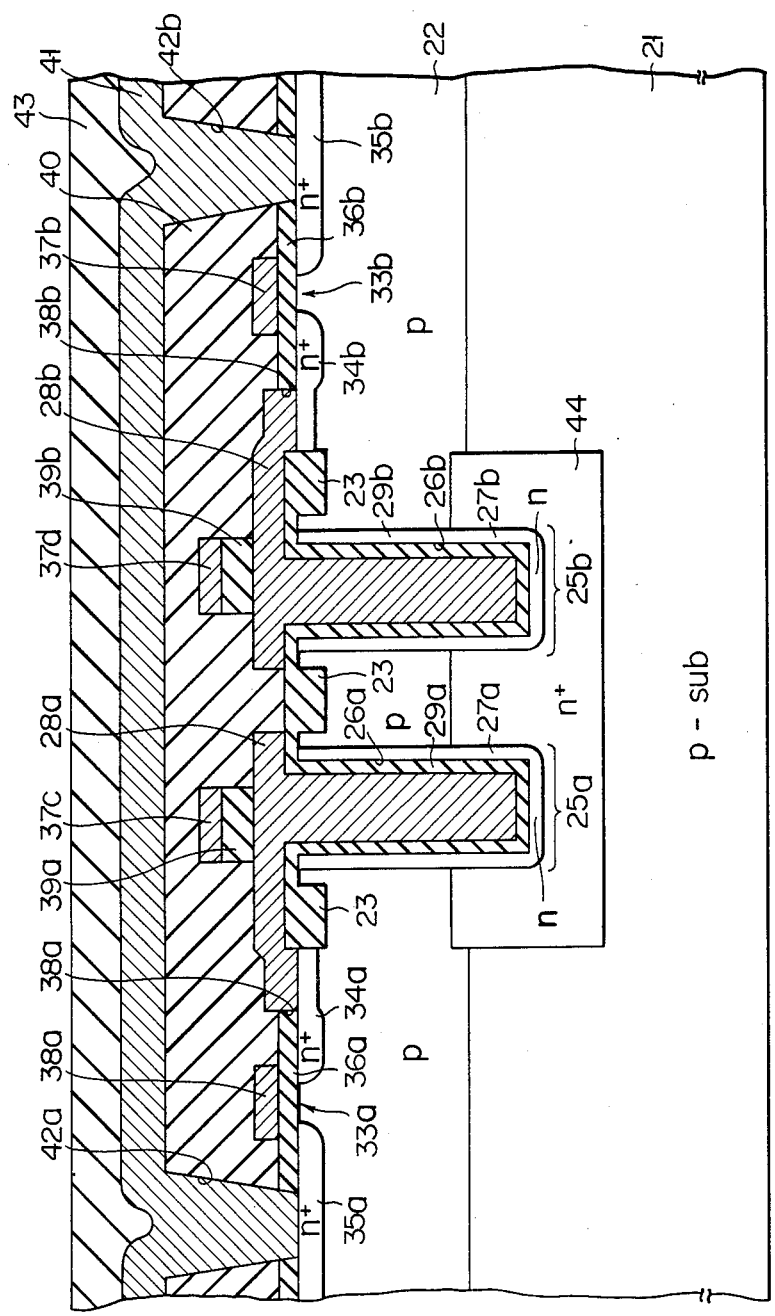
FIG. 5 is a sectional view showing a main part of a dynamic MOS memory according to another embodiment of the present invention.

In the above embodiment, the structure in which the p-type silicon layer is formed on the n-type silicon substrate is used as a semiconductor body. However, the present invention is not limited to this. For example, as shown in FIG. 5, the p-type silicon layer 22 is formed on a p-type silicon substrate 21', and an n-type buried layer 44 is formed at an interface between the substrate 21' and the silicon layer 22. In this case, the grooves 26a and 26b of the trenched capacitors 25a and 25b are formed so as to extend from a surface of the silicon layer 22 to a position inside the n-type buried layer 44 through the silicon layer 22. The grooves 26a and 26b are surrounded by the n-type diffusion regions 27a and 27b. The n-type regions 27a and 27b are formed on portions of the silicon layer 22 and the buried layer 44 which define the grooves 26a and 26b. The structure of other elements is substantially the same as that of the first embodiment. Therefore, the same reference numerals as in the first embodiment denote the same parts in this embodiment, and a detailed description thereof is omitted. According to this structure, a potential (e.g., 0 V) of the n-type buried layer 44 (with respect to the n-type diffusion regions 27a and 27b as the second capacitor electrodes) can be independently set from the p-type silicon substrate 21'. Therefore, a bias potential of the substrate 21' can be freely selected in accordance with characteristics of the transfer transistors regardless of characteristics of the trenched capacitors 25a and 25b.

As described above, according to the present invention, there can be provided a high-density and highly reliable semiconductor memory device which comprises a trenched capacitor having a long memory data holding time, i.e, a pause time, and in which a distance between two adjacent trenched capacitors can be shortened without causing the punch through phenomenon.

What is claimed is:

1. A semiconductor memory device comprising:
   (a) a semiconductor body comprising (i) a semiconductor substrate of a first conductivity type, (ii) a semiconductor layer of said first conductivity type formed on said semiconductor substrate, and (iii) a buried layer of a second conductivity type formed at an interface between said semiconductor substrate and said semiconductor layer;
   (b) a plurality of transfer transistors each comprising (i) source and drain regions which are formed in a surface region of said semiconductor layer so as to be electrically isolated from each other and (ii) a gate electrode which is formed on a portion of said semiconductor layer between said source and drain regions; and
   (c) a plurality of trenched capacitors each comprising (i) a groove formed so as to extend from said surface region of said semiconductor layer to a depth at least as deep as the upper surface of said buried layer, (ii) an impurity diffusion region of said second conductivity type acting as one electrode of said trenched capacitor and formed to be fully surrounded by the portion of said semiconductor layer and said buried layer which define said groove, (iii) an insulation film formed on said groove and acting as a dielectric of said trenched capacitor, and (iv) a conductive layer acting as the other electrode of said trenched capacitor formed on said insulation film and extending from a bottom portion of said groove to at least a level above an opening of said groove, said impurity diffusion region being applied with an electric potential by said buried layer, one of said source and drain regions of each transfer transistor being in buried contact with said other electrode of one of said trenched capacitors and the other of said source and drain regions of each transfer transistor being connected to a bit line.

2. A semiconductor memory device according to claim 1, wherein in said semiconductor body said first conductivity type is a P conductivity type and said second conductivity type is a N conductivity type.

3. A semiconductor memory device according to claim 1, wherein the impurity concentration of said buried layer is higher than that of said impurity diffusion region.

4. A semiconductor memory device according to claim 2, wherein the impurity concentration of said buried layer is higher than that of said impurity diffusion region.

* * * * *